(12) United States Patent
Lee (10) Patent No.: US 9,696,344 B2
(45) Date of Patent: Jul. 4, 2017

(54) TEST SOCKET WHICH ALLOWS FOR EASE OF ALIGNMENT

(71) Applicant: ISC CO., LTD., Seongnam-si, Gyeonggi-do (KR)

(72) Inventor: Jae Hak Lee, Seongnam-si (KR)

(73) Assignee: ISC Co, Ltd., Seongnam-si, Gyeonggi-do (KR)

( * ) Notice: Subject to any disclaimer, the term of this patent is extended or adjusted under 35 U.S.C. 154(b) by 38 days.

(21) Appl. No.: 14/396,250

(22) PCT Filed: Apr. 29, 2013

(86) PCT No.: PCT/KR2013/003671
§ 371 (c)(1),
(2) Date: Oct. 22, 2014

(87) PCT Pub. No.: WO2013/162343
PCT Pub. Date: Oct. 31, 2013

(65) Prior Publication Data
US 2015/0084658 A1 Mar. 26, 2015

(30) Foreign Application Priority Data
Apr. 27, 2012 (KR) .................. 10-2012-0044683

(51) Int. Cl.
*G01R 31/20* (2006.01)
*G01R 1/04* (2006.01)
(Continued)

(52) U.S. Cl.
CPC ......... *G01R 1/0416* (2013.01); *G01R 1/0466* (2013.01); *G01R 31/28* (2013.01);
(Continued)

(58) Field of Classification Search
CPC ...... G01R 1/04; G01R 1/0408; G01R 1/0433; G01R 1/0491; G01R 1/06744;
(Continued)

(56) References Cited

U.S. PATENT DOCUMENTS 4,548,862 A 10/1985 Hartman
4,998,062 A * 3/1991 Ikeda .................. G01R 1/0735
324/72.5

(Continued)

FOREIGN PATENT DOCUMENTS

CN 1774839 A 5/2006
CN 101373204 2/2009
(Continued)

OTHER PUBLICATIONS

Office Action in corresponding Japanese Application 2015-508874 dated Sep. 29, 2015, 5 pages.
(Continued)

*Primary Examiner* — Tung X Nguyen
(74) *Attorney, Agent, or Firm* — Harness, Dickey & Pierce, P.L.C.

(57) ABSTRACT

The present invention relates to a test socket which allows for ease of alignment, and more particularly, to a test socket that is interposed between a device to be inspected and an inspection apparatus so as to electrically connect terminals of the device to be inspected and pads of the inspection apparatus, the test socket including: an alignment member that has a plurality of through-holes formed at points corresponding to the terminals of the device to be inspected or the pads of the inspection apparatus and is attached to the inspection apparatus such that the through-holes are located at the pads of the inspection apparatus; and an elastic conductive sheet including conductive parts that are disposed at the points corresponding to the terminals of the (Continued)

device to be inspected and include a plurality of conductive particles that are distributed in an insulating elastic material, insulating support parts that support the conductive parts and disconnect an electrical connection between adjacent conductive parts, and protruding conductive parts that protrude downward from the conductive parts and are inserted into the plurality of through-holes of the alignment member, wherein when the protruding conductive parts are inserted into the through-holes of the alignment member, the elastic conductive sheet is aligned in the the alignment member.

8 Claims, 8 Drawing Sheets

(51) Int. Cl.
*G01R 31/28* (2006.01)
*H01R 12/71* (2011.01)
*H01R 12/73* (2011.01)
*H01R 13/24* (2006.01)

(52) U.S. Cl.
CPC ............ *H01R 12/714* (2013.01); *H01R 12/73* (2013.01); *H01R 13/2414* (2013.01); *H01R 13/2421* (2013.01); *H01R 2201/20* (2013.01)

(58) Field of Classification Search
CPC  G01R 1/073; G01R 1/07342; G01R 31/2601; G01R 31/2886; G01R 31/2887; G01R 31/2891
See application file for complete search history.

(56) References Cited

U.S. PATENT DOCUMENTS

| | | | |
|---|---|---|---|
| 2001/0049208 A1* | 12/2001 | Igarashi | H05K 7/20472 439/68 |
| 2008/0218177 A1 | 9/2008 | Alladio et al. | |
| 2011/0057676 A1* | 3/2011 | Ho | G01R 1/06722 324/755.05 |
| 2012/0106111 A1 | 5/2012 | Mazzochette et al. | |

FOREIGN PATENT DOCUMENTS

| | | |
|---|---|---|
| JP | 2000-215930 | 8/2000 |
| JP | 2009-115463 | 5/2009 |
| JP | 2011-150837 A | 8/2011 |
| KR | 102005008740 A | 8/2005 |
| KR | 10-0797406 B1 | 1/2008 |
| KR | 102009009458 A | 9/2009 |
| KR | 102010000553 A | 1/2010 |
| KR | 102011008578 A | 7/2011 |
| KR | 10-2011-0087437 | 8/2011 |
| WO | 2004093252 A3 | 4/2005 |

OTHER PUBLICATIONS

Chinese Office Action dated Dec. 28, 2015, of the Chinese Patent Application No. 201380021680.9, corresponding to the instant U.S. Application (In Chinese only).
International Search Report and Written Opinion (in Korean with English Translation) for PCT/KR2013/003671, mailed Jul. 29, 2013; ISA/JP.

\* cited by examiner

TEST SOCKET WHICH ALLOWS FOR EASE OF ALIGNMENT

TECHNICAL FIELD

The present invention relates to a test socket which allows for ease of alignment, and more particularly, to a test socket which allows for ease of alignment so that space efficiency may be maximized and easy alignment may be performed.

BACKGROUND ART

In general, in order to inspect the electrical properties of a device, the device has to be stably electrically connected to a test apparatus. In general, a test socket is used as a tool for electrically connecting the device and the test apparatus.

The test socket is used to connect terminals of the device and pads of the test is apparatus and enable electrical signals to be exchanged between the device and the test apparatus. For this purpose, the test socket includes an elastic conductive sheet or a pogo pin as a connection medium. The elastic conductive sheet that connects elastic conductive parts to the terminals of the device to be inspected and the pogo pin that includes a spring therein are used in most test sockets to easily establish a connection between a device to be inspected and a test apparatus, and may also reduce a mechanical impact during the connection.

Figure 1:
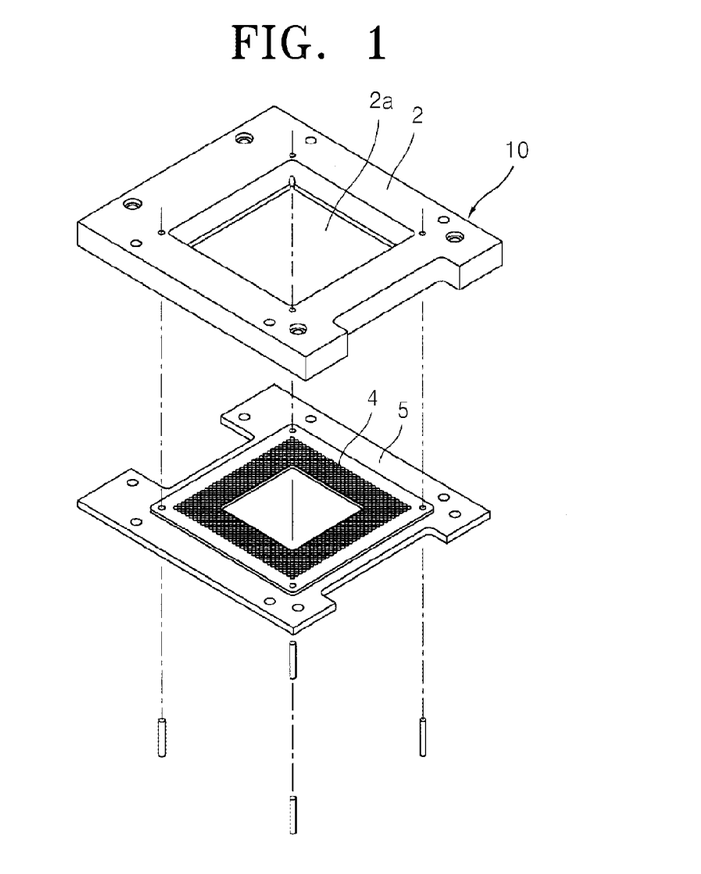
FIG. 1 is a perspective view of a test socket according to a conventional technology.
Figure 2:
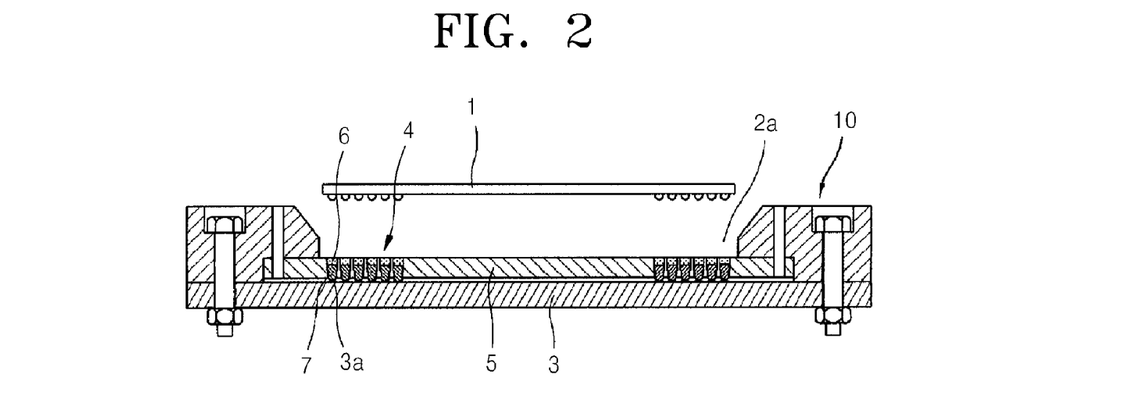
FIG. 2 is a cross-sectional view of the test socket of FIG. 1.

A test socket including an elastic conductive sheet according to the conventional technology is disclosed in Korean Patent Publication No. 10-2005-0087400 as shown in FIGS. 1 and 2. A test socket 10 includes a socket housing 2 that has a frame shape and has an opening 2a that is formed in a central portion thereof and through which a semiconductor package 1 may be input/output, and a gate plate 5 that has an insulating plate shape, is closely fixed to a top surface of a test board 3 via the socket housing 2, and allows a plurality of contactors 4 that are provided thereon to be electrically connected between terminals of the semiconductor package 1 and a contact pad 3a of the test board 3. The contactors 4 include conductive rubbers 6 that adhesively fill upper portions of inner areas of through-holes that vertically pass through the guide plate and contact pins 7 that are inserted into lower portions of the inner areas of the through-holes, are attached to the conductive rubbers 6, and protrude downward by different lengths.

According to the test socket of FIGS. 1 and 2, in order to align the contactors on the test board, a separate socket housing that is coupled by bolts to the test board has to be provided. When the socket housing is used, sufficient use of a space around the test board is limited. That is, a space of the test board on which the socket housing is seated is not used, thereby reducing the overall space use efficiency.

Figure 3:
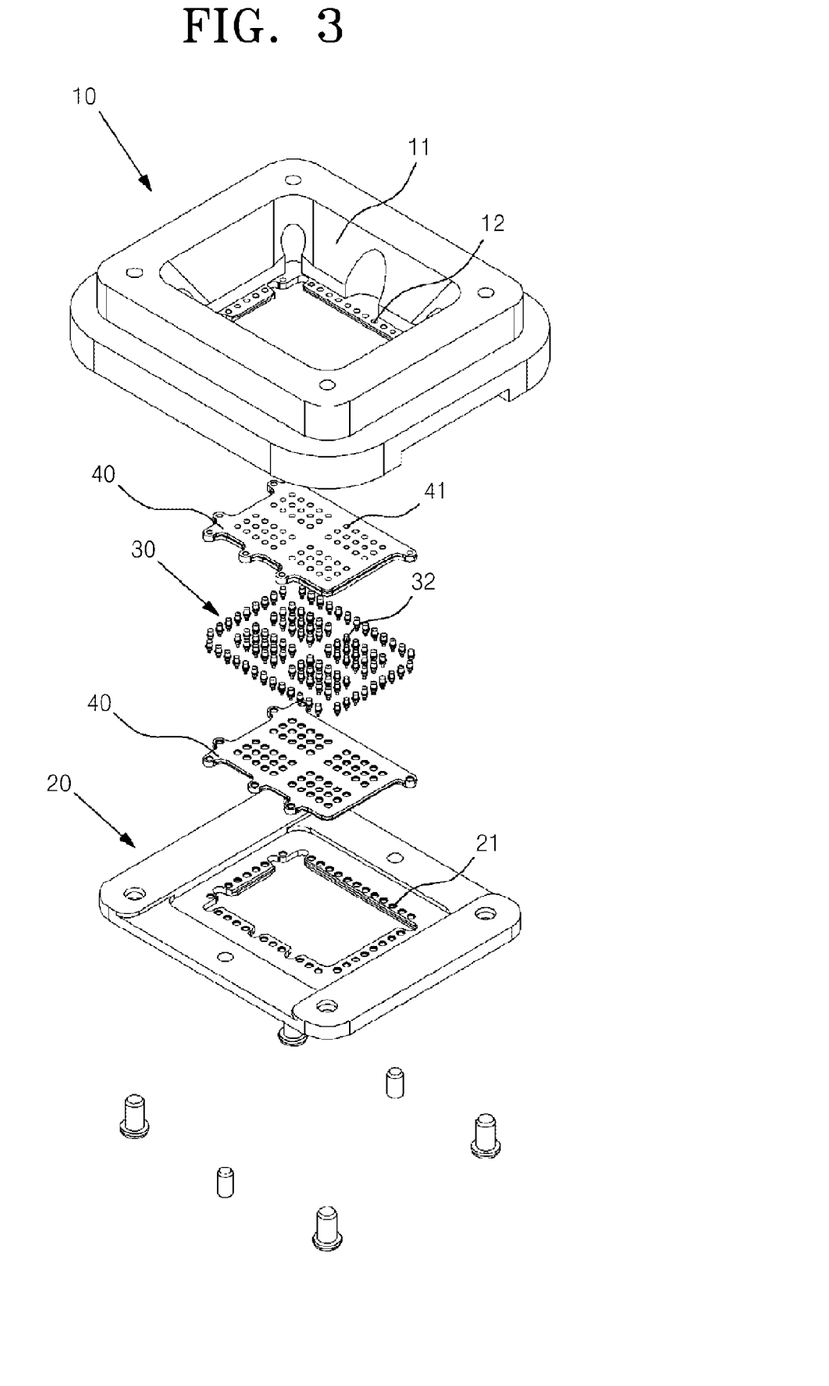
FIG. 3 is a view illustrating another test socket according to the conventional technology.

Also, as shown in FIG. 3, other test socket including a pogo pin according to the conventional technology is disclosed in Korean Patent Publication No. 10-2009-0094584. The test socket includes a housing 10 that includes a receiving part 11 in which a semiconductor chip is received and upper connector holes 12 that are formed in a lower portion of the receiving part 11; a base cover 20 that is coupled to a lower portion of the housing 10 and has lower connector holes 21 formed therein; a connector 30 that is coupled to the upper and lower connector holes 12 and 21 and has a lower portion that contacts a substrate and an upper portion that contacts the semiconductor chip; and a ground block 40 that is coupled between the housing 10 and the base cover 20, has a plate shape, has ground connector holes 41 formed therein, and electrically grounds ground connectors 32 of the connector 30.

The test socket according to the conventional technology has also a problem in that use of a space of the test board is limited due to the base cover that is seated on the test board. That is, a space occupied by the base cover is not sufficiently used, thereby reducing the overall space use efficiency.

Figure 4:
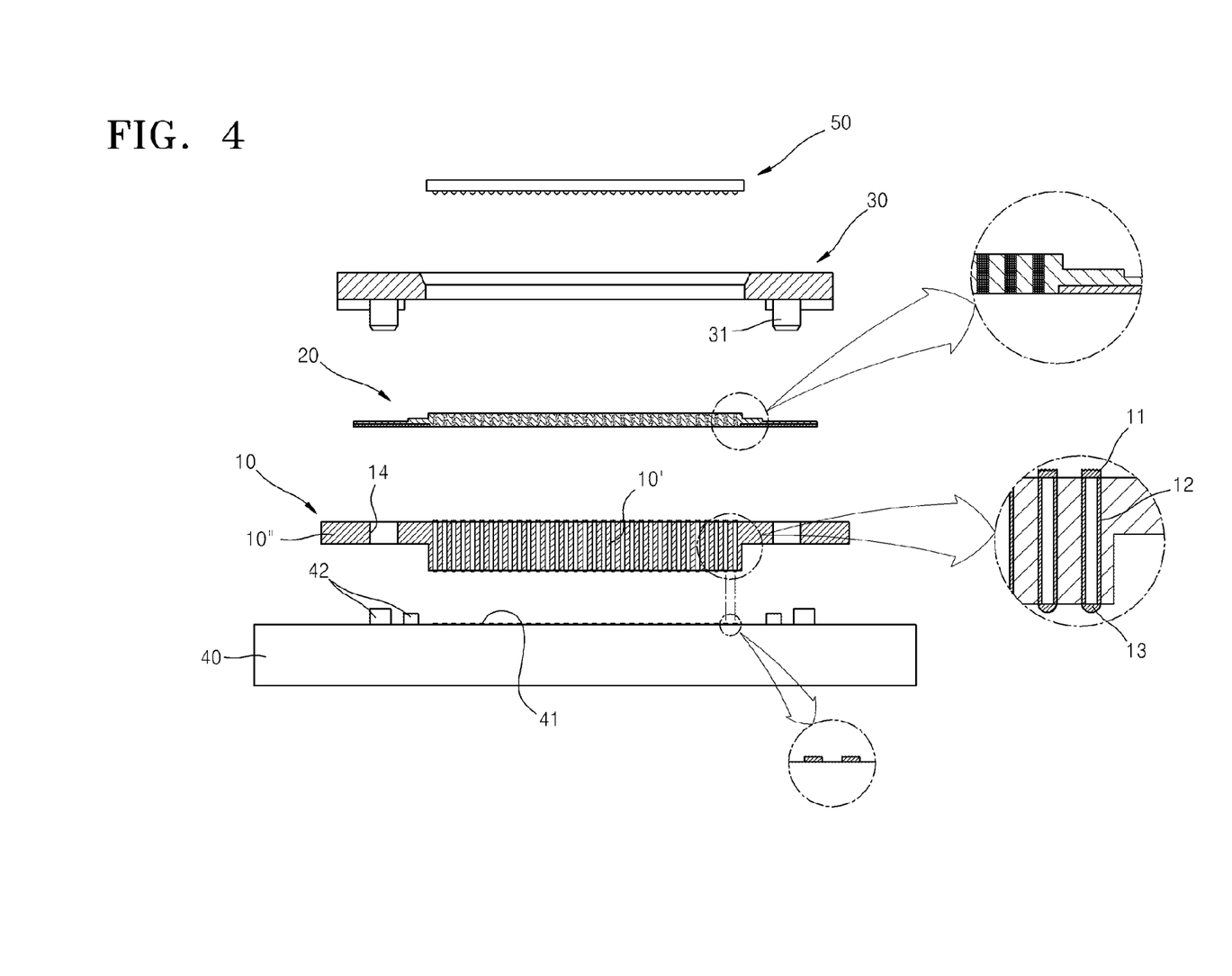
FIGS. 4 and 5 are views illustrating another test socket according to the conventional technology.
Figure 5:
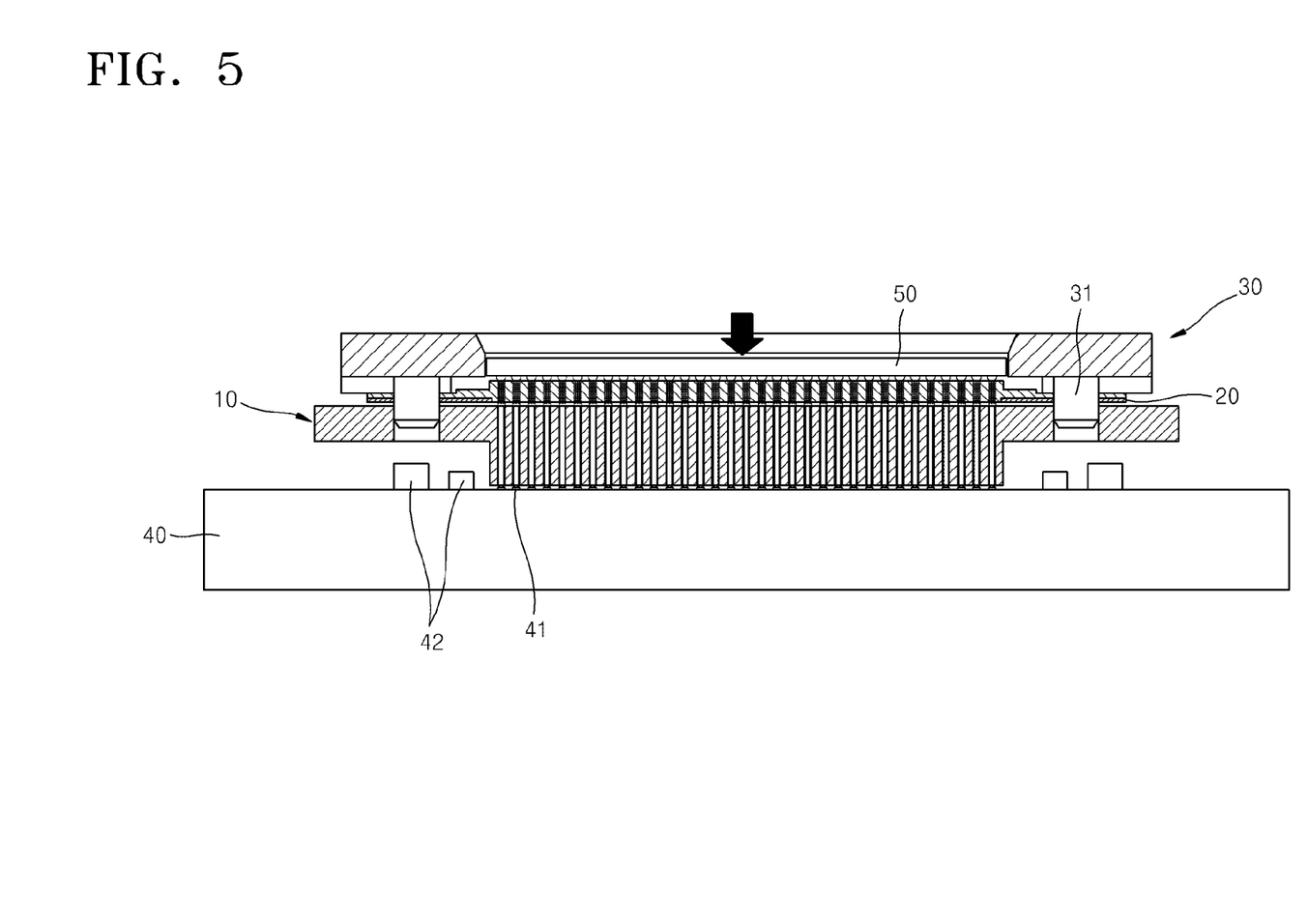

A test socket as shown in FIGS. 4 and 5 has been suggested in order to maximize space utilization of a test board of FIGS. 1 through 3.

The test socket of FIGS. 4 and 5 includes an interface substrate 10 that is coupled by soldering to a test board 40, an elastic conductive sheet 20 that is disposed on the substrate, and a guide block 30 that fixes the elastic conductive sheet 20 to the interface substrate. In detail, when predetermined components 42 are arranged around an inspection area where a plurality of inspection pads are arranged, the interface substrate 10 including terminals that are adhered by soldering to the inspection pads 41 is fixed. Via holes 12 that may vertically communicate are formed in a central portion 10' of the interface substrate 10, upper terminals 11 that contact elastic portions of the elastic conductive sheet are disposed on upper ends of the via holes, and solder balls 13 that are adhered by soldering to the inspection pads are disposed on lower ends of the via holes. The interface substrate 10 may be fixed to the test board 40 when the solder balls 13 are respectively adhered to the inspection pads 41 by soldering. A lower end of a peripheral portion 10" that is formed around a central portion of the interface substrate is processed to have a stepped portion, and thus components that are arranged around the inspection area are prevented from interfering with each other due to a space that is formed by the stepped portion. Through-holes 14 that may align the guide block are formed in the peripheral portion 10", and thus the elastic conductive sheet 20 that is disposed between the peripheral portion 10" and the guide block 30 may be aligned when guide pins 31 of the guide block 30 are inserted into the through-holes. A device to be inspected 50 is configured to contact a top surface of the elastic conductive sheet 20.

The test socket according to the conventional technology has an advantage in that the peripheral portion of the inspection area of the test board may be more sufficiently used in terms of space utilization than the test socket of FIGS. 1 through 3. That is, even when predetermined components are arranged around the inspection area, since the lower end of the peripheral portion of the interface substrate is processed to have the stepped portion, the components are prevented from interfering with each other due to a space that is formed by the stepped portion.

The test socket of FIGS. 4 and 5 has the following problems.

First, an electrical signal is transmitted from the test board to a semiconductor package through the interface substrate and the elastic conductive sheet. Accordingly, an overall current pass is longer than that of the test socket of FIGS. 1 through 3, and thus, the electrical signal transmission characteristics are degraded.

Also, high temperature heat is applied to the test board when the interface substrate and the test board are adhered to each other by using soldering. In this case, the test board may be damaged. Since the test board is more expensive than the test socket, when the test board is damaged, costs for replacing the test board are excessively high.

Also, as the interface substrate is additionally provided, an overall size of the apparatus is increased. That is, as the interface substrate is provided, a size of the test socket is increased.

DETAILED DESCRIPTION OF THE INVENTION

Technical Problem

In order to solve the afore-described problems, the present invention provides a test socket that maximizes space utilization of an inspection apparatus, improves the overall signal transmission characteristics, and is easily manufactured.

Technical Solution

According to an aspect of the present invention, there is provided a test socket that is interposed between a device to be inspected and an inspection apparatus so as to electrically connect terminals of the device to be inspected and pads of the inspection apparatus, the test socket including: an alignment member that has a plurality of through-holes formed at points corresponding to the terminals of the device to be inspected or the pads of the inspection apparatus and is attached to the inspection apparatus such that the through-holes are located at the pads of the inspection apparatus; and an elastic conductive sheet including conductive parts that are disposed at the points corresponding to the terminals of the device to be inspected and include an insulating elastic material and a plurality of conductive particles that are distributed in the insulating elastic material, insulating support parts that support the conductive parts and prevent electricity passing between adjacent conductive parts, and protruding conductive parts that protrude downward from the conductive parts and are inserted into the plurality of through-holes of the alignment member, wherein when the protruding conductive parts are inserted into the through-holes of the alignment member, the elastic conductive sheet is aligned in the alignment member.

In the test socket, heights of the protruding conductive parts may be greater than depths of the through-holes.

In the test socket, the insulating support parts may be spaced apart from the alignment member.

In the test socket, the alignment member may be adhered to a surface of the inspection apparatus by using an adhesive.

In the test socket, the adhesive may be formed of a hot melt resin.

In the test socket, the alignment member may have a size corresponding to a cross-sectional area of an inspection area where the pads of the inspection apparatus are arranged.

In the test socket, the protruding conductive parts may include an elastic material and a plurality of conductive particles that are distributed in the elastic material.

In the test socket, the alignment member may be a sheet formed of a resin material or a fiber-reinforced resin material.

A guide sheet may be disposed on an upper end of the elastic conductive sheet and has guide holes formed at the points corresponding to the terminals of the device to be inspected.

According to another aspect of the present invention, there is provided a test socket that is interposed between a device to be inspected and an inspection apparatus so as to electrically connect terminals of the device to be inspected and pads of the inspection apparatus, the test socket including: an alignment member that has a plurality of through-holes formed at points corresponding to the terminals of the device to be inspected or the pads of the inspection apparatus and is attached to the inspection apparatus such that the through-holes are located at the pads of the inspection apparatus; and a conductive connector including a housing that has receiving holes formed at the points corresponding to the terminals of the device to be inspected and pogo members that are inserted into the receiving holes of the housing, are compressed and decompressed along longitudinal directions of the receiving holes, and have lower ends that protrude from the receiving holes and are inserted into the through-holes of the alignment member, wherein when the lower ends of the pogo members are inserted into the through-holes of the alignment member, the conductive connector is aligned in the alignment member.

In the test socket, each of the pogo members may include an upper pin, a lower pin, and a spring member that is interposed between the upper pin and the lower pin and generates an elastic pressure to increase a distance between the upper pin and the lower pin, wherein at least a part of the lower pin is inserted into a corresponding one of the through-holes of the alignment member.

Advantageous Effects

A test socket according to the present invention may maximize space utilization of an inspection apparatus and wherein an elastic conductive sheet may be aligned by inserting protruding conductive parts of the elastic conductive sheet into an alignment member that is attached to the inspection apparatus.

Also, the test socket according to the present invention may prevent signal transmission characteristics from being reduced and may reduce an overall current pass by allowing the elastic conductive sheet to directly contact the inspection apparatus, and may reduce inspection costs by having an overall simplified alignment structure.

MODE OF THE INVENTION

The present invention will now be described more fully with reference to the accompanying drawings, in which exemplary embodiments of the invention are shown.

Figure 6:
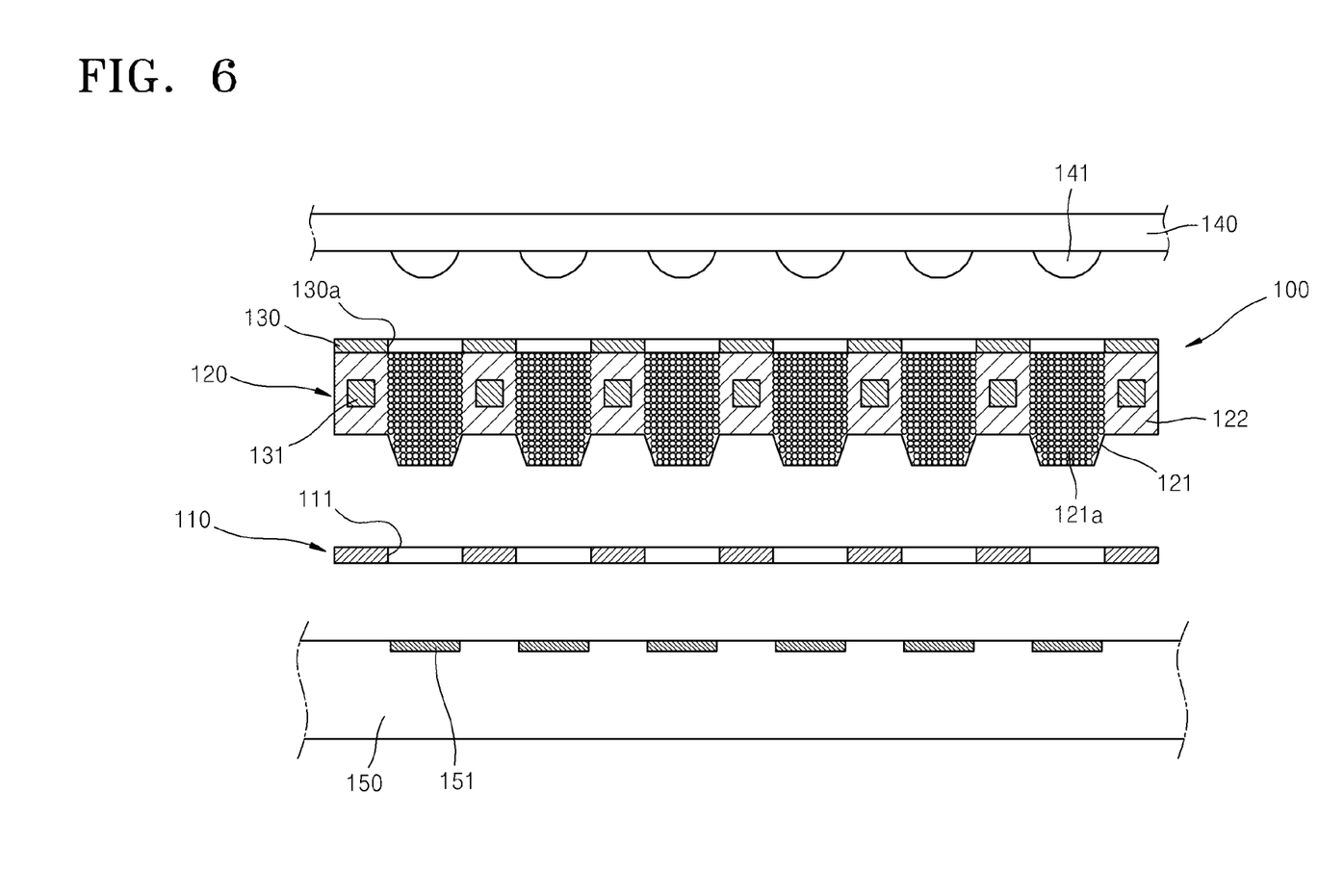
FIG. 6 is an exploded view illustrating a test socket according to an embodiment of the present invention.
Figure 7:
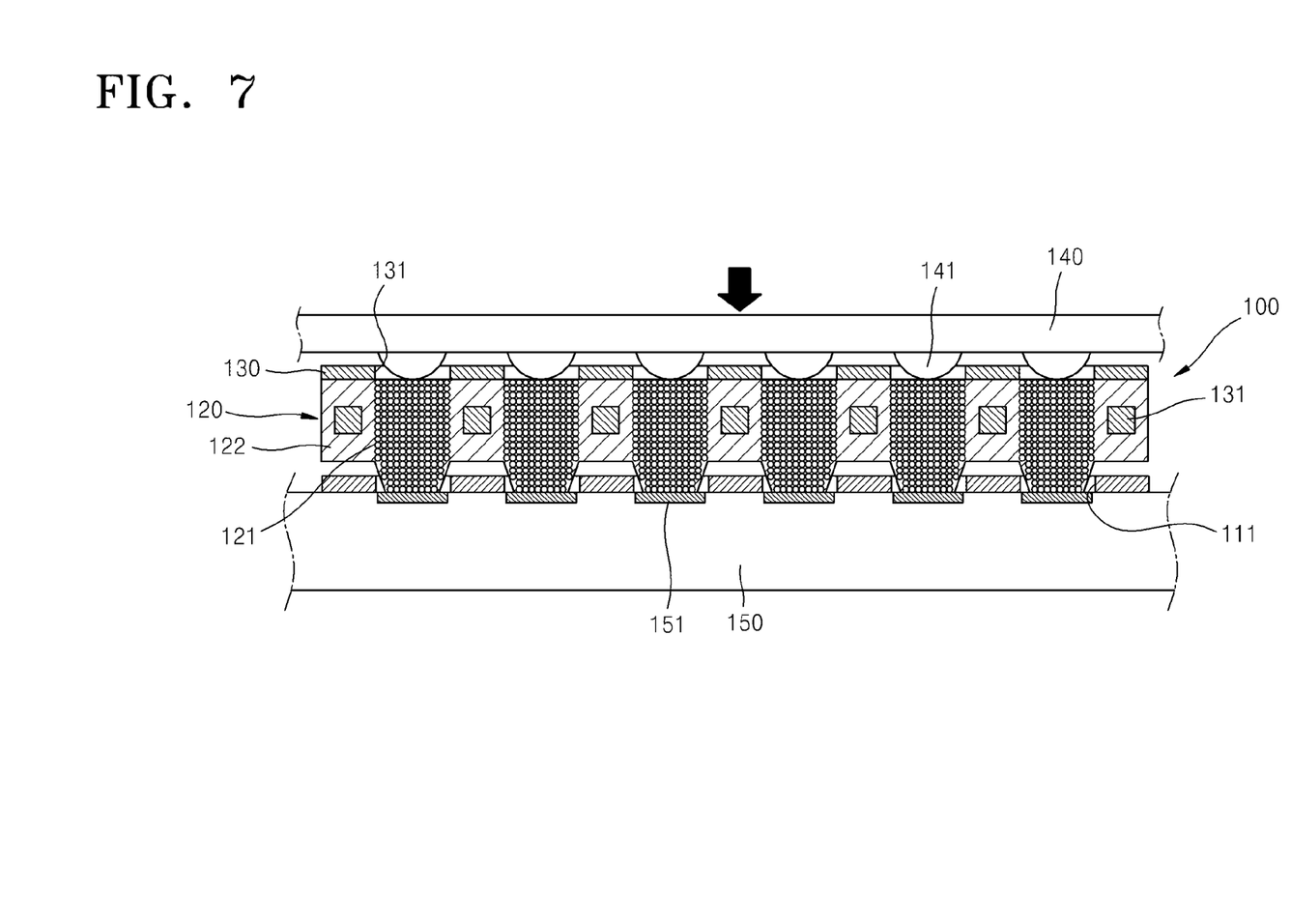
FIG. 7 is an assembled view of the test socket of FIG. 6.

A test socket according to an embodiment of the present invention is interposed between a device to be inspected and an inspection apparatus so as to electrically connect terminals of the device to be inspected and pads of the inspection apparatus and includes an alignment member and an elastic conductive sheet.

The alignment member 110 has a plurality of through-holes 111 formed at points corresponding to terminals 141 of the device to be inspected 140 or pads 151 of the inspection apparatus 150 and is attached to the inspection apparatus 150 such that the through-holes 111 are located at the pads 151 of the inspection apparatus 150.

The alignment member 110 may be a sheet (or a film) formed of a resin material or a fiber-reinforced resin material. In detail, the alignment member 110 may be formed of a resin material such as liquid crystalline polymer, polyimide resin, polyester resin, polyaramid resin, or polyamide resin, a fiber-reinforced resin material such as glass fiber-reinforced epoxy resin, glass fiber-reinforced polyester resin, or glass fiber-reinforced polyimide resin, or a compounded resin material obtained by adding as a filler an inorganic material such as alumina or boron nitride to epoxy resin.

The alignment member 110 may be attached to the inspection apparatus 150 by using a silicon-based adhesive that is cured at an adhesive temperature in a range from about 100° C. to about 200° C. However, the adhesive is not limited to the silicon-based adhesive, and an adhesive including any of various hot melt resins may be used. The silicon-based adhesive is coated on a rear surface of the alignment member 110, the alignment member 110 is aligned with the inspection apparatus 150, and then the alignment member 110 is heated at a temperature of about 180° C. by being pressed in a thickness direction to cure the silicon-based adhesive. Accordingly, the alignment member 110 may be fixed to the inspection apparatus 150.

The alignment member 110 having a substantially plate shape may have a size corresponding to an inspection area where the pads 151 of the inspection apparatus 150 are arranged. In detail, the alignment member 110 may be disposed to have a cross-sectional area slightly greater than the inspection area where the pads 151 of the inspection apparatus 150 are arranged.

The elastic conductive sheet 120 includes conductive parts 121 that are disposed at the points corresponding to the terminals 141 of the device to be inspected 140, insulating support parts 122 that support and insulate the conductive parts 121, and protruding conductive parts 123 that protrude downward from the conductive parts 121 and are inserted into the through-holes 111 of the alignment member 110.

The conductive parts 121 are disposed at the points corresponding to the terminals 141 of the device to be inspected 140, and include an insulating elastic material a plurality of conductive particles 121a that are aligned in the thickness direction in the insulating elastic material.

It is preferable that the insulating elastic material that is used to form the conductive parts 121 is a polymer material having a heat resistance and a cross-linked structure. Various curable polymer forming materials that may be used to obtain the cross-liked polymer material may be used, but a liquid silicon rubber is preferable. The liquid silicon rubber may be an addition type liquid silicon rubber or a condensation type liquid silicon rubber, and the addition type liquid silicon rubber is preferable. When the conductive parts 121 are formed of a cured product of a liquid silicon rubber (hereinafter, referred to as a 'silicon rubber cured product'), a permanent compression distortion of the silicon cured product at 150° C. is preferably equal to or less than 10%, more preferably equal to or less than 8%, and more preferably equal to or less than 6%. Assuming that the permanent compression distortion exceeds 10%, when the elastic conductive sheet 120 is repeatedly used in a high temperature environment, chains between the conductive particles 121a of the conductive parts 121 are destroyed, thereby making it difficult to maintain the necessary conductivity.

It is preferable that the conductive particles 121a are magnetic core particles on a surface of which a high-conductive metal is coated. Examples of a material that is used to form the magnetic core particles include iron, nickel, cobalt, and a material obtained by coating the metal on copper or resin, but also a material having a saturation magnetization that is preferably be equal to or greater than 0.1 Wb/m$^2$, more preferably equal to or greater than 0.3 Wb/m$^2$, and particularly preferably equal to or greater than 0.5 Wb/m$^2$ may be used In detail, iron, nickel, cobalt, or an alloy thereof may be used.

Examples of the high-conductive metal that is coated on the surface of the magnetic core particles include gold, silver, rhodium, platinum, and chromium, but gold that is chemically stable and has high conductivity is preferable.

The insulating support parts 122 function to support the conductive parts 121 and prevent electricity passing between adjacent the conductive parts 121. Although the insulating support parts 122 may be formed of the same elastic material as that of the conductive parts 121, the present embodiment is not limited thereto and any material that has high elasticity and excellent insulation properties may be used.

The protruding conductive parts 123 protrude downward from the conductive parts 121 and are inserted into the through-holes 111 of the alignment member 110. In detail, when the protruding conductive parts 123 are inserted into the through-holes 111 of the alignment member 110, the elastic conductive sheet may be aligned in the the alignment member 110 without moving horizontally. The protruding conductive parts 123 may include the plurality of conductive particles 121a that are distributed in an elastic material, and specifically, may be formed of the same material as that of the conductive parts 121.

The protruding conductive parts 123 have substantially circular cross-sections and protrude downward, and heights of the protruding conductive parts 123 may be greater than depths of the through-holes 111 or a thickness of the alignment member 110. As such, when the heights of the protruding conductive parts 123 are greater than the depths of the through-holes 111, the insulating support parts 122 may be spaced apart by a predetermined interval from the alignment member 110, and thus, a space for compressing the elastic conductive sheet 120 may be formed.

Reference numerals 130 and 131 respectively denote a guide sheet and support frames. The guide sheet 130 is disposed on an upper end of the elastic conductive sheet 120 and has guide holes formed at the points corresponding to the terminals 141 of the device to be inspected 140. The terminals 141 of the device to be inspected 140 may be guided through the guide holes to contact the conductive parts 121.

Also, the support frames 131 are interposed between the insulating support parts 122 and support the elastic conductive sheet 120.

The test socket according to the present embodiment of the present invention has the following effects.

First, the alignment member 110 is first attached to the inspection apparatus 150, and then the elastic conductive sheet 120 is received in the through-holes 111 of the alignment member 110. In detail, the elastic conductive sheet 120 may be aligned with the alignment member 110 by inserting the protruding conductive parts 123 into the through-holes 111 of the alignment member 110.

In this case, although the protruding conductive parts 123 may be forcibly inserted into the through-holes 111, the present embodiment is not limited thereto and as long as the elastic conductive sheet 120 is prevented from moving, diameters of the protruding conductive parts 123 may be less than that of the through-holes 111.

As such, when the protruding conductive parts 123 are inserted into the through-holes 111, bottom surfaces of the protruding conductive parts 123 are directly aligned with the pads 151 of the inspection apparatus 150. As such, after the elastic conductive sheet 120 is seated on the inspection apparatus 150, the terminals 141 of the device to be inspected 140 are brought into contact with the conductive parts 121 of the elastic conductive sheet 120. Next, when a predetermined electrical inspection signal is output from the pads 151 of the inspection apparatus 150, the signal passes through the elastic conductive sheet 120 and is transmitted to the device to be inspected 140, and thus a predetermined electrical inspection process may be conducted.

When the elastic conductive sheet needs to be replaced due to its frequent contact, the elastic conductive sheet may be easily replaced by removing it from the through-holes of the alignment member and inserting a new elastic conductive sheet into the through-holes of the alignment member.

The test socket according to the present embodiment of the present invention may be easily aligned by attaching the alignment member to the inspection apparatus and inserting the elastic conductive sheet into the through-holes of the alignment member to align the elastic conductive sheet. Also, even when predetermined components are arranged around the inspection area where the pads of the inspection apparatus are distributed, the test socket may be disposed without interference of the components, thereby maximizing an overall space use efficiency.

Also, the test socket according to the present invention may ensure inspection reliability by allowing the elastic conductive sheet to directly contact the pads of the inspection apparatus while maximizing the overall space use efficiency.

The test socket according to the present embodiment of the present invention may be modified as follows.

First, although the test stock includes the alignment member and the elastic conductive sheet, the present embodiment is not limited thereto and a conventional pogo pin instead of the elastic conductive sheet may be used.

Figure 8:
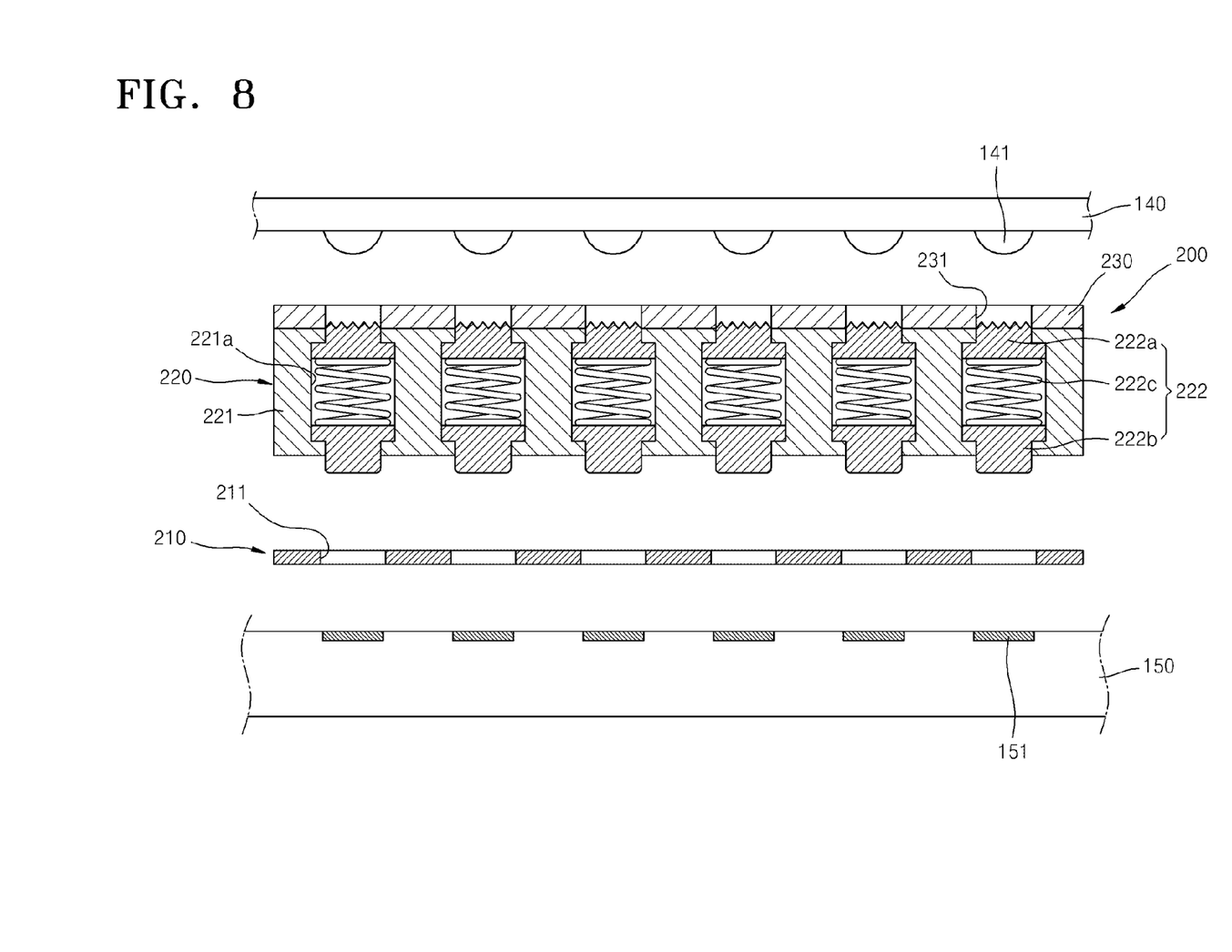
FIG. 8 is an exploded view illustrating a test socket according to another embodiment of the present invention.
Figure 9:
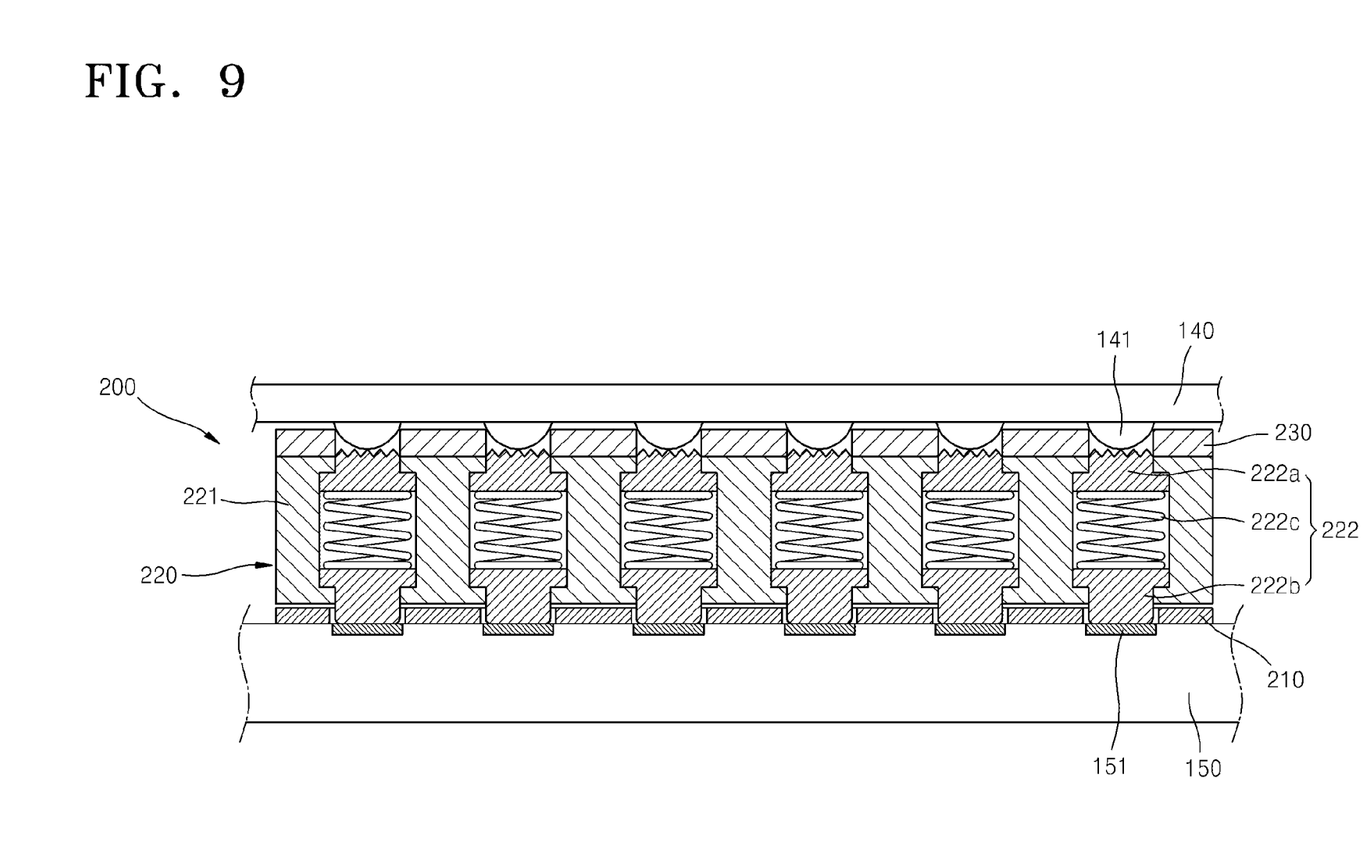
FIG. 9 is an assembled view of the test socket of FIG. 8.

For example, as shown in FIGS. 8 and 9, a test socket 200 includes an alignment member 210 and a conductive connector 220. In this case, the alignment member 210 is the same as the alignment member of FIGS. 6 and 7, and thus a detailed explanation thereof will not be given. The conductive connector 220 includes a housing 221 that has receiving holes 221a formed at points corresponding to the terminals of the device to be inspected, and pogo members 222 that are inserted into the housing 221 may be compressed and decompressed along longitudinal directions of the receiving holes 221a, and have lower ends that protrude downward from the receiving holes 221a and are inserted into the through-holes 211 of the alignment member 210.

In this case, when the lower ends of the pogo members 222 are inserted into the through-holes of the alignment member 210, the conductive connector may be aligned in the the alignment member 210. Each of the pogo members 222 includes an upper pin 222a, a lower pin 222b, and a spring member 222c that is interposed between the upper pin 222a and the lower pin 222b and generates an elastic pressure to increase a distance between the upper pin and the lower pin. In this case, at least a part of the lower pin 222b is inserted into a corresponding one of the through-holes 211 of the alignment member 210.

The test socket according to the another embodiment of the present invention may be easily manufactured and may maximize space use efficiency by allowing the lower pins of the pogo member to be inserted into the through-holes of the alignment member to align the conductive connector.

While the present invention has been particularly shown and described with reference to exemplary embodiments thereof, they are provided for the purposes of illustration and it will be understood by those of ordinary skill in the art that various modifications and equivalent other embodiments can be made from the present invention.

The invention claimed is:

1. A test socket interposed between a device to be inspected and an inspection apparatus to electrically connect terminals of the device to be inspected and pads of the inspection apparatus, the test socket comprising:
    an alignment member having a plurality of through-holes corresponding with the terminals of the device to be inspected and coupled to the inspection apparatus such that the through-holes are located at the pads of the inspection apparatus;
    an elastic conductive sheet comprising a plurality of conductive parts corresponding with the terminals of the device to be inspected and the through-holes of the alignment member, and a plurality of insulating support parts that support the conductive parts and prevent electricity from passing between adjacent conductive parts, wherein each conductive part includes a plurality of conductive particles and a portion protruding away from the elastic conductive sheet and inserted into a corresponding through-hole of the alignment member; and
    a guide sheet deposited on the elastic conductive sheet on a side opposite the protrusions of the conductive parts, wherein the guide sheet includes a plurality of guide holes corresponding with the terminals of the device to be inspected and the terminals of the device to be inspected are inserted into the corresponding guide holes of the guide sheet,
    wherein when the protruding conductive parts are inserted into the through-holes of the alignment member and the terminals of the device to be inspected are inserted into the guide holes of the guide sheet, the elastic conductive sheet is aligned with the alignment member, the guide sheet, and the terminals of the device to be inspected.

2. The test socket of claim 1, wherein heights of the protruding conductive parts are greater than depths of the through-holes.

3. The test socket of claim 2, wherein the insulating support parts are spaced apart from the alignment member.

4. The test socket of claim 1, wherein the alignment member is adhered to a surface of the inspection apparatus by using an adhesive.

5. The test socket of claim 4, wherein the adhesive is formed of a hot melt resin.

6. The test socket of claim 1, wherein the alignment member has a size corresponding to a cross-sectional area of an inspection area where the pads of the inspection apparatus are arranged.

7. The test socket of claim 1, wherein the protruding conductive parts comprise an elastic material and a plurality of conductive particles that are distributed in the elastic material.

8. The test socket of claim 1, wherein the alignment member is a sheet formed of a resin material or a fiber-reinforced resin material.

\* \* \* \* \*